(12) United States Patent
Chen

(10) Patent No.: US 7,545,615 B2
(45) Date of Patent: Jun. 9, 2009

(54) LCD SOURCE DRIVER FOR IMPROVING ELECTROSTATIC DISCHARGE

(75) Inventor: Yi-Chan Chen, Madou Township, Tainan County (TW)

(73) Assignee: Elan Microelectronics Corporation, Hsinchu (TW)

( * ) Notice: Subject to any disclaimer, the term of this patent is extended or adjusted under 35 U.S.C. 154(b) by 343 days.

(21) Appl. No.: 11/477,360

(22) Filed: Jun. 30, 2006

(65) Prior Publication Data
US 2007/0057327 A1  Mar. 15, 2007

(30) Foreign Application Priority Data
Sep. 12, 2005  (TW)  .............................. 94131375 A

(51) Int. Cl.
*H02H 9/00*  (2006.01)

(52) U.S. Cl. ......................................................... 361/56
(58) Field of Classification Search ................... 361/56
See application file for complete search history.

(56) References Cited

U.S. PATENT DOCUMENTS 6,753,836 B2 *  6/2004  Kwon .......................... 345/87

\* cited by examiner

*Primary Examiner*—Stephen W Jackson
(74) *Attorney, Agent, or Firm*—Rosenberg, Klein & Lee

(57) ABSTRACT

In an LCD source driver, to enhance the ESD performance thereof, there is provided a path in a device area penetrating thereacross such that an internal power wire or an internal ground wire to connect between an output pad and a power-rail ESD clamp circuit on two margins, respectively, of the LCD source driver could pass through the path to shorten the internal power wire or the internal ground wire and thereby to avoid chip area increase for the ESD mechanism.

5 Claims, 4 Drawing Sheets

LCD SOURCE DRIVER FOR IMPROVING ELECTROSTATIC DISCHARGE

FIELD OF THE INVENTION

The present invention is related generally to a source driver for liquid crystal display (LCD) and, more particularly, to an LCD source driver having improved electrostatic discharge (ESD) protection.

BACKGROUND OF THE INVENTION

For ESD enhancement each integrated circuit are not only provided with protection circuits to the I/O pads on the chip, but also inserted with power-rail ESD clamp circuits between the internal power wires and the internal ground wires thereof. Typically, for better ESD performance, the power-rail ESD clamp circuits are prepared at every distance of the internal wires. The shorter or the wider the internal power wire or the internal ground wire is, the better the ESD performance is.

However, the arrangement of power-rail ESD clamp circuits is always limited by the layout of integrated circuit. As shown in FIG. 1, an LCD source driver 10 has a rectangular top plane, and for plenty of output channels, there is always a long margin thereof to provide for output pads 14. Therefore, this long margin has no other space for arrangement of power-rail ESD clamp circuits 16, and the power wires and the ground wires 18 for the output pads 14 must extend along with the edge of the device area 12 to the power-rail ESD clamp circuits 15 on the short margin, even to the power-rail ESD clamp circuits 16 on the opposite long margin. The LCD source driver 10 shown in FIG. 1 is just for illustration, the ratio of the long margin to the short margin in a real LCD source driver 10 is much greater than 10:1, usually 13-17:1. Namely, the power wires and the ground wires 18 for the middle output pads 14 are much longer, causing poor ESD performance. To improve the ESD performance, conventionally, the widths of the power wires and the ground wires 18 are made wider, or the chip area of the power-rail ESD clamp circuits 16 are enlarged. However, either one of them will increase the chip size of the LCD source driver 10. Moreover, the development of LCD source driver is toward high pin count, and the shape of LCD source driver becomes longer as the number of output channels increases. If the chip is still designed as the conventional manner, the ESD performance will be worse and worse.

Therefore, it is desired an LCD source driver having improved ESD performance without increasing chip area.

SUMMARY OF THE INVENTION

An object of the present invention is to improve the ESD performance of an LCD source driver not by increasing the chip area.

According to the present invention, an LCD source driver comprises a device area, a power-rail ESD clamp circuit and an output pad, in which the device area has a path such that the output pad is electrically connected to the power-rail ESD clamp circuit by a wire passing through the path.

Since the wire electrically connected between the output pad and the power-rail ESD clamp circuit penetrates the device are through the path, it is much shorter than that in the case of extending along with the edge of the device area. As a result, the ESD performance of the LCD source driver is improved.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
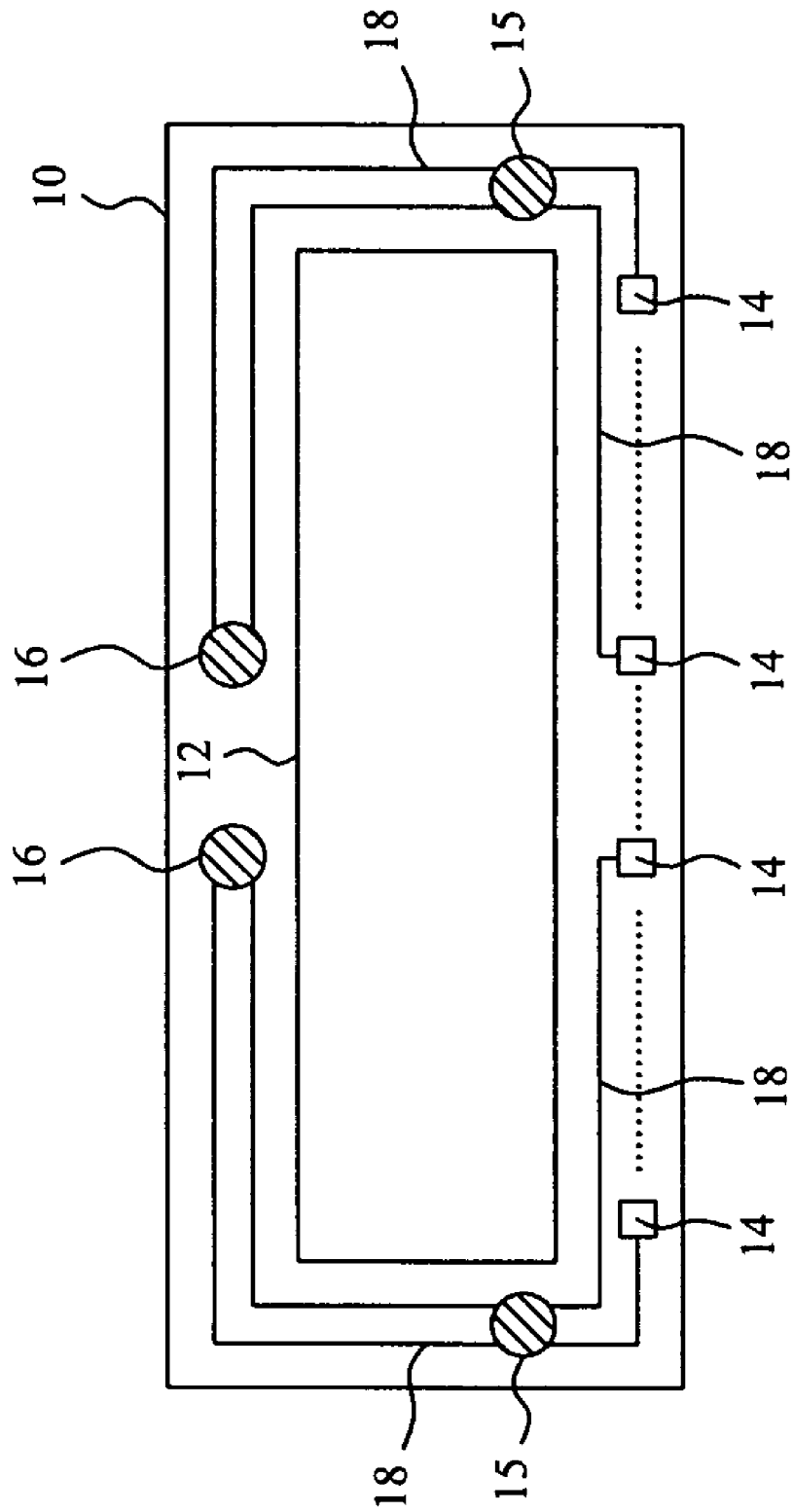
FIG. 1 schematically shows a conventional LCD source driver.
Figure 2:
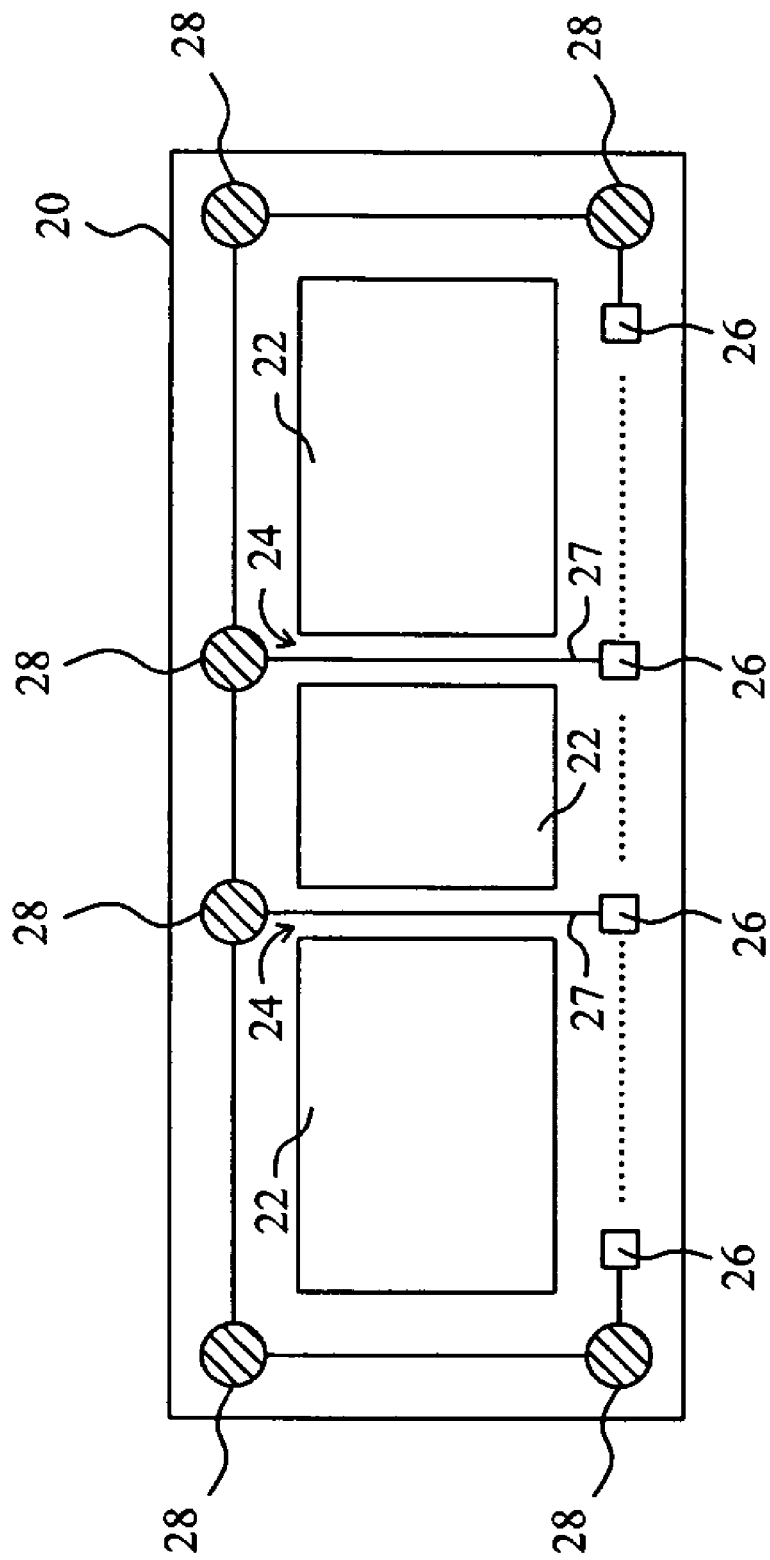
FIG. 2 is a first embodiment of the present invention.

FIG. 2 shows a first embodiment of the present invention. In an LCD source driver 20, a device area 22 has two straight paths 24 thereof, power wires or ground wires 27 for output pads 26 around the middle of the long margin of the LCD source driver 20 extend through the paths 24 to electrically connect to the power-rail ESD clamp circuits 28 on the opposite long margin. The LCD source driver 20 shown in FIG. 2 is a simplified schematic diagram without showing the real scaled size which usually has a ratio of long margin to short margin about 13-17:1. With the paths 24, the output pads 26 nearby the middle of the long margin can directly connect to the power-rail ESD clamp circuits 28 on the opposite long margin through the paths 24, without extending around the whole device area 22, and the power wires or the ground wires 27 are much shorter. Therefore, the ESD performance is improved without widening the power wires or the ground wires 27, or enlarging the power-rail ESD clamp circuits 28. In other word, for the LCD source driver 20 according to the present invention having the same chip area as the traditional LCD source driver 10, the LCD source driver 20 has better ESD performance. If the LCD source driver 20 according to the present invention is designed to have the same ESD performance as the traditional LCD source driver 10, the chip area of the LCD source driver 20 is smaller than that of the traditional one 10.

Figure 3:
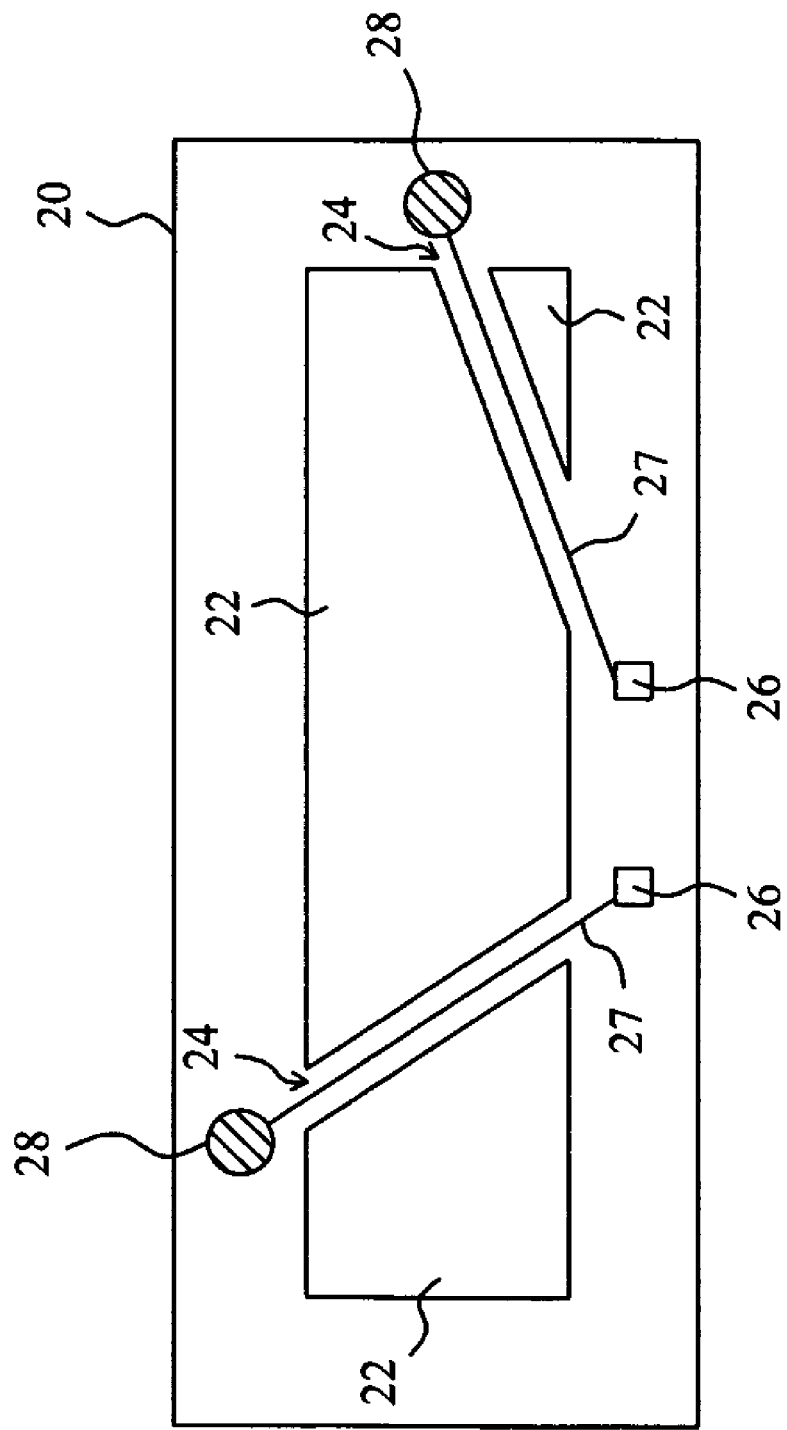
FIG. 3 is a second embodiment of the present invention.

FIG. 3 shows a second embodiment of the present invention, in which the paths 24 are not in the direction vertically to the long margin of the LCD source driver 20. One of the paths 24 extends from the long margin where the output pads 26 are to the opposite one in a slant angle, and the other slantwise extends from the long margin where the output pads 26 are to a short margin.

Figure 4:
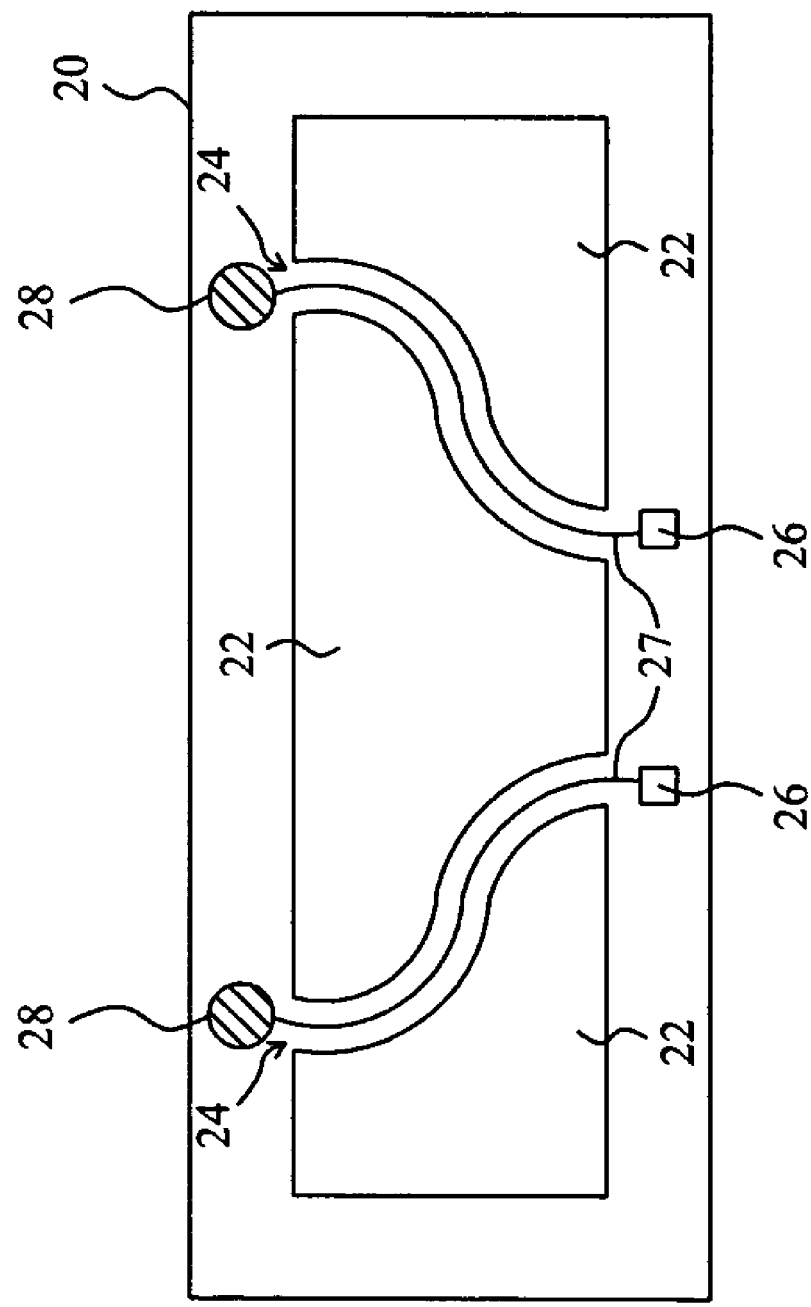
FIG. 4 is a third embodiment of the present invention.

FIG. 4 shows a third embodiment of the present invention, in which the paths 24 crookedly extend from the long margin where the output pads 26 are to the opposite one.

In other embodiments, no matter how many paths 24 are in the device area 22 or what shape they are, if the path 24 extends from a long margin to another one or to a short margin for internal power wire or internal ground wire, it is always within the scope of the present invention.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set fourth in the appended claims.

What is claimed is:

1. An LCD source driver comprising:
   an output pad;
   a power-rail ESD clamp circuit; and a device area having a path for providing a wire to electrically connect the output pad to the power-rail ESD clamp circuit;

wherein the output pad and the power-rail ESD clamp circuit are respectively on two opposite long margins.

2. An LCD source driver comprising:

an output pad;

a power-rail ESD clamp circuit; and a device area having a path for providing a wire to electrically connect the output pad to the power-rail ESD clamp circuit;

wherein the output pad is on a long margin, and the power-rail ESD clamp circuit is on a short margin.

3. The LCD source driver of claim 1, wherein the path extends in a direction vertically to two opposite long margins.

4. An LCD source driver comprising:

an output pad;

a power-rail ESD clamp circuit; and a device area having a path for providing a wire to electrically connect the output pad to the power-rail ESD clamp circuit;

wherein the path extends from a first long margin to a second long margin opposite to the first long margin in a slant angle.

5. The LCD source driver of claim 2, wherein the path extends from a long margin to a short margin.

\* \* \* \* \*